United States Patent
Araoka

(10) Patent No.: US 11,271,080 B2
(45) Date of Patent: Mar. 8, 2022

(54) SILICON CARBIDE SEMICONDUCTOR DEVICE AND METHOD FOR MANUFACTURING SILICON CARBIDE SEMICONDUCTOR DEVICE

(71) Applicant: Fuji Electric Co., Ltd., Kanagawa (JP)

(72) Inventor: Tsuyoshi Araoka, Fukushima (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 22 days.

(21) Appl. No.: 16/985,532

(22) Filed: Aug. 5, 2020

(65) Prior Publication Data
US 2021/0091187 A1    Mar. 25, 2021

(30) Foreign Application Priority Data
Sep. 20, 2019 (JP) .............................. JP2019-171064

(51) Int. Cl.
| | |
|---|---|
| H01L 29/16 | (2006.01) |
| H01L 21/82 | (2006.01) |
| H01L 29/08 | (2006.01) |
| H01L 29/417 | (2006.01) |
| H01L 29/78 | (2006.01) |
| H01L 29/66 | (2006.01) |

(52) U.S. Cl.
CPC ........ *H01L 29/1608* (2013.01); *H01L 29/086* (2013.01); *H01L 29/41766* (2013.01); *H01L 29/66068* (2013.01); *H01L 29/7802* (2013.01)

(58) Field of Classification Search
CPC ................... H01L 21/82; H01L 21/823; H01L 21/823807; H01L 21/823842; H01L 29/16; H01L 29/1608; H01L 29/08; H01L 29/086; H01L 29/41; H01L 29/42766; H01L 29/42; H01L 29/4236; H01L 29/49; H01L 29/4916; H01L 29/66; H01L 29/66068; H01L 29/78; H01L 29/7801; H01L 29/7813

USPC ......................................................... 257/288
See application file for complete search history.

(56) References Cited

U.S. PATENT DOCUMENTS

| | | | |
|---|---|---|---|
| 2004/0014264 A1* | 1/2004 | Oh ................... | H01L 21/823892 438/197 |
| 2006/0108589 A1 | 5/2006 | Fukuda et al. | |
| 2008/0224209 A1* | 9/2008 | Chun ............... | H01L 21/823807 257/334 |
| 2008/0286920 A1* | 11/2008 | Kim ................ | H01L 21/823892 438/218 |
| 2017/0194438 A1 | 7/2017 | Kumagai et al. | |

* cited by examiner

FOREIGN PATENT DOCUMENTS

| | | |
|---|---|---|
| JP | 2004-71750 A | 3/2004 |
| JP | 2017-168602 A | 9/2017 |
| WO | 2016/114057 A1 | 8/2017 |

*Primary Examiner* — Fazli Erdem
(74) *Attorney, Agent, or Firm* — Chen Yoshimura LLP

(57) ABSTRACT

A silicon carbide semiconductor device includes a gate insulating film and a gate electrode made of $p^+$ polysilicon doped with boron at a high concentration. Among boron impurities contained in the polysilicon of the gate electrode, $^{11}B$, which is one of the isotopes of boron, is contained 90% or more, thereby reducing the amount of $^{10}B$ diffusing from the polysilicon of the gate electrode into the gate insulating film. This results in a suppression of a threshold voltage shift that occurs when AC voltage is applied to the gate electrode.

10 Claims, 10 Drawing Sheets

SILICON CARBIDE SEMICONDUCTOR DEVICE AND METHOD FOR MANUFACTURING SILICON CARBIDE SEMICONDUCTOR DEVICE

BACKGROUND OF THE INVENTION

Technical Field

The present invention is related to a silicon carbide semiconductor device and a method of manufacturing a silicon carbide semiconductor device.

Background Art

Because silicon carbide (SiC) has a larger band gap than silicon (Si), SiC has a high dielectric breakdown electric field strength. Because the ON resistance, which is the resistance when the semiconductor device is turned on, is inversely proportional to the cube of the breakdown electric field strength, when a widely-used 4H silicon carbide semiconductor (four-layer periodic hexagonal silicon carbide: 4H—SiC) is used, the ON resistance of the resultant device may be reduced as low as $\frac{1}{100}$th of that of silicon semiconductor devices.

Because of this and its large thermal conductivity, which is advantageous for heat discharging, silicon carbide semiconductor is expected to gain popularity as the next-generation low loss power semiconductor. For example, using silicon carbide, various semiconductor devices, such as Shockey diodes, MOSFET (Metal Oxide Semiconductor Field Effect Transistor), PN diodes, IGBT (Insulated Gate Bipolar Transistor), have been developed.

In silicon carbide semiconductor devices, p$^+$ polysilicon is often used as the gate electrode in order to adjust the threshold voltage. (See, Patent Document 1, for example.) Further, a barrier film that contains titanium (Ti) is often formed under the source electrode in order to prevent fluctuations in the threshold voltage due to the voltage application to the gate electrode. (See, Patent Document 2, for example.)

RELATED ART DOCUMENT

Patent Document

Patent Document 1: Japanese Patent Application Laid-Open Publication No. 2004-71750
Patent Document 2: Japanese Patent Application Laid-Open Publication No. 2017-168602

SUMMARY OF THE INVENTION

However, when reliability tests were actually performed on silicon carbide semiconductor devices by applying AC voltages on the gate electrode, the threshold voltage shifts of about 0.3V was observed. Thus, it is necessary to further suppress the threshold voltage shifts. The present invention has been devised in light of this consideration and aims to provide a silicon carbide semiconductor device having smaller threshold voltage shifts and to provide a manufacturing method for such a silicon carbide semiconductor device.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a silicon carbide semiconductor device, comprising: a semiconductor substrate of a first conductivity type, made of silicon carbide; a semiconductor layer of the first conductivity type, made of silicon carbide, on a front surface of the semiconductor substrate; a first semiconductor region of a second conductivity type, made of silicon carbide, selectively disposed on the semiconductor layer; a second semiconductor region of the first conductivity type, made of silicon carbide, selectively disposed on the first semiconductor region; a third semiconductor region of the second conductivity type, made of silicon carbide, selectively disposed on the first semiconductor region, the third semiconductor region having a higher impurity concentration than the first semiconductor region; a gate insulating film disposed on a surface formed continuously by a surface of the semiconductor layer, a surface of the first semiconductor region, and a surface of the second semiconductor region; a gate electrode on the gate insulating film, made of p$^+$ polysilicon that includes boron as impurities; an interlayer insulating film covering the gate electrode, the interlayer insulating film having an opening partially exposing the second semiconductor region and the third semiconductor region; a source contact electrode in contact with the second semiconductor region and the third semiconductor region exposed in the opening of the interlayer insulating film; a conductive barrier film covering and contacting the interlayer insulating film and the source contact electrode; a front surface electrode covering and contacting the conductive barrier film; and a back surface electrode disposed on a back surface of the semiconductor substrate, wherein among boron impurities contained in the gate electrode, $^{11}$B is contained 90% or more.

In the above-described silicon carbide semiconductor device, among the boron impurities contained in the gate electrode, $^{11}$B may be contained 95% or more. A concentration of $^{10}$B impurities in the gate electrode may be 1×10$^{17}$ cm$^{-3}$ or less. A concentration of $^{10}$B impurities may be 1.5×10$^{17}$ cm$^{-3}$ or less in the gate insulating film at a position 10 nm deep inside from an interface between the gate electrode and the gate insulating film. An area concentration of $^{10}$B impurities in the gate insulating film may be 2.5×10$^{14}$ cm$^{-2}$ or less. The interlayer insulating film may be a laminate film including a first interlayer insulating film that does not include boron and that is in contact with the gate electrode and a second interlayer insulating film covering the first interlayer insulating film.

In another aspect, the present disclosure provides a method of manufacturing a silicon carbide semiconductor device, comprising: forming a semiconductor layer of a first conductivity type, made of silicon carbide, on a front surface of a semiconductor substrate of a first conductivity type made of silicon carbide; forming a first semiconductor region of a second conductivity type, made of silicon carbide, selectively on the semiconductor layer; forming a second semiconductor region of the first conductivity type and a third semiconductor region of the second conductivity type, both made of silicon carbide, selectively on the first semiconductor region; forming a gate insulating film on a surface formed continuously by a surface of the semiconductor layer, a surface of the first semiconductor region, and a surface of the second semiconductor region; forming a non-doped polysilicon film on the gate insulating film; ion-implanting only $^{11}$B impurities selectively among boron isotopes into the non-doped polysilicon film to form a gate electrode made of p$^+$ polysilicon; forming an interlayer insulating film covering the gate electrode, the interlayer insulating film having an opening partially exposing the second semiconductor region and the third semiconductor region; forming a source contact electrode in contact with the second semiconductor region and the third semiconductor region exposed in the opening of the interlayer insulating film; forming a back surface electrode on a back surface of the semiconductor substrate; forming a conductive barrier film covering and contacting the interlayer insulating film and the source contact electrode; and forming a front surface electrode covering and contacting the conductive barrier film.

In the above-described method, the forming of the interlayer insulating film may include: forming a first interlayer insulating film that does not include boron, the first interlayer insulating film being in contact with the gate electrode; and forming a second interlayer insulating film covering the first interlayer insulating film, thereby forming the interlayer insulating film made of a laminate of the first interlayer insulating film and the second interlayer insulating film. Further, the above-described method may further include: after the forming of the interlayer insulting film, performing a thermal treatment that rounds corners and ridges of the interlayer insulating film and that activates and diffuses the $^{11}$B impurities that have been ion-implanted into the gate electrode.

According to the silicon carbide semiconductor device and its manufacture method of the present invention, the undesired threshold shifts can be reduced.

It is to be understood that both the foregoing general description and the following detailed description are exemplary and explanatory, and are intended to provide further explanation of the invention as claimed.

DETAILED DESCRIPTION OF EMBODIMENTS

Figure 1:
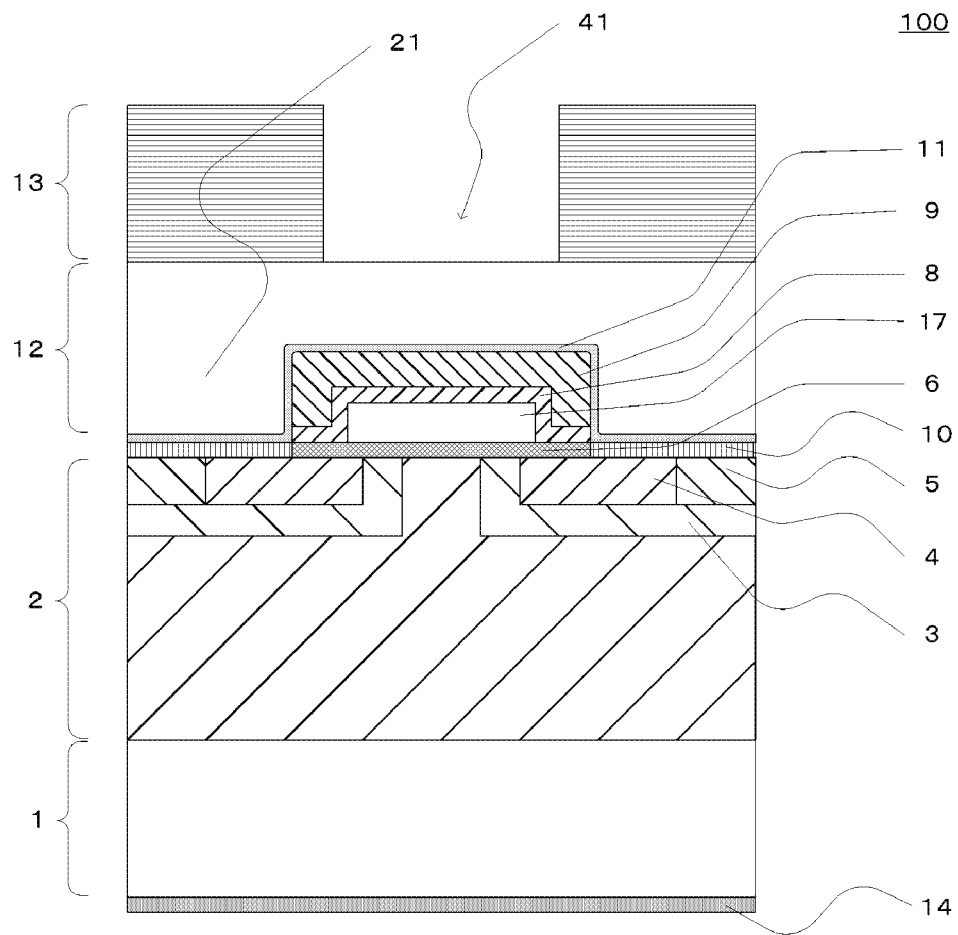
FIG. 1 is a schematic cross-sectional view of main parts of a silicon carbide semiconductor device according to Embodiment 1 of the present invention.

Referring to the drawings, preferred embodiments of the present invention for a silicon carbide semiconductor device and its manufacture method are described. In the present specification and drawings, layers, films and regions bearing n or p mean respectively that the majority carriers are electrons or holes, respectively. Further the + sign or − sign attached to n or p means that such regions are higher or lower impurity concentrations than regions without it. The regions bearing the same n or p legend (with + or − signs or without it) means that the impurity concentrations of these regions are close, but do not necessarily mean that these regions have the exact same impurity concentrations. Furthermore, in the embodiments and drawings described below, same or similar components are assigned the same reference characters or numbers to avoid duplicate explanations.

Embodiment 1

An embodiment of a silicon carbide semiconductor device according to the present invention is explained using a planar type MOSFET as an example. FIG. 1 is a cross-sectional view schematically showing main parts of a planar gate MOSFET 100, which is a silicon carbide semiconductor device according to Embodiment 1 of the present invention. FIG. 1 shows a unit cell in the active region of the device. Other cells that are repeatedly arranged adjacent to this cell and a voltage withstand structure that surrounds the periphery of the active region are omitted.

The drain region of the planar gate MOSFET 100 is constituted of an n$^+$ silicon carbide substrate 1 (a semiconductor substrate of a first conductivity type). The n$^+$ silicon carbide substrate 1 is, for example, a four-layer periodic hexagonal (4H) single crystal silicon carbide substrate doped with nitrogen (N) at a high concentration.

In a front surface of the n$^+$ silicon carbide substrate 1, an n$^−$ drift layer 2 (a semiconductor layer of the first conductivity type) is disposed. The n$^−$ drift layer 2 is, for example, a silicon carbide layer doped with nitrogen. The impurity concentration in the n⁻ drift layer 2 is lower than that in the n⁺ silicon carbide substrate 1.

On the surface side of the n⁻ drift layer 2, a MOS (Metal-Oxide-Semiconductor) structure is provided. Specifically, in a surface of the n⁻ drift layer 2, p well regions 3 (a first semiconductor region of a second conductivity type) are selectively formed. In a surface of each p well region 3, an n⁺ source region 4 (a second semiconductor region of the first conductivity type) is selectively formed. Also, in a surface of each p well region 3, next to the n⁺ source region 4, a p⁺ contact region 5 (a third semiconductor region of the second conductivity type), which has a higher impurity concentration than the p-well region 3, is selectively formed. Here, as impurities for controlling the conductivity type for the regions 3 to 5, phosphorous (P) or nitrogen (N) is doped in the n-type regions, and aluminum (Al) is doped in the p-type region.

On the surfaces of the p well regions 3 and n⁻ drift layer 2, a gate electrode 17 is disposed with a gate insulating film 6 interposed in between. The gate insulating film 6 is a silicon oxide film, which may contain nitrogen.

The gate electrode 17 is formed of p⁺ polysilicon. The polysilicon making up the gate electrode 17 is doped with boron (B) at a high concentration as impurities that control the conductivity type. This completes the MOS structure.

Here, boron has two isotopes with mass numbers 10 and 11. The natural abundance ratio is: $^{10}B$ (an isotope with a mass number of 10) being 19.9%, and $^{11}B$ (an isotope with a mass number of 11) being 80.1%. Normally, when the gate electrode 17 is made without controlling the isotope ratio, the resulting polysilicon of the gate electrode 17 includes $^{10}B$ and $^{11}B$ at the natural abundance ratio.

One aspect of the present invention aims to dope only $^{11}B$ in the polysilicon that constitutes the gate electrode 17. In reality, a minute amount of $^{10}B$ (an isotope with a mass number of 10) will be included. Thus, the content of $^{11}B$ is set to at least 90% of the entire boron impurities contained in the polysilicon of the gate electrode 17. It is more preferable to have at least 95% of the $^{11}B$ content in the entire boron impurities. Further, the concentration of $^{10}B$ in the polysilicon of the gate electrode 17 is preferably equal to or less than $1.0 \times 10^{17}$ cm$^{-3}$. Also, the concentration of $^{10}B$ in the gate insulating film 6 at a position 10 nm deep inside from the interface of the gate electrode 17 and gate insulting film 6 is preferably equal to or less than $1.5 \times 10^{17}$ cm$^{-3}$. The area concentration of $^{10}B$ in B the gate insulating film 6 is preferably $2.5 \times 10^{-14}$ cm$^{-2}$ or less.

On the surface of the gate electrode 17, an interlayer insulating film is formed so as to cover the gate electrode 17. The interlayer insulating film has a laminate structure made of a first interlayer insulating film 8 that covers the gate electrode 17 and a second interlayer insulating film 9 that covers the first interlayer insulating film 8. The first interlayer insulating film 8 is an insulating film that does not contain boron impurities, and is made of NSG (Non-doped Silicate Glass), for example. The second interlayer insulating film 9 is an insulating film that contains boron and/or phosphorus, and is made of BPSG (Boron Phosphorus doped Silicate Glass). The first interlayer insulating film 8 is preferably 100 nm to 300 nm thick in order to prevent impurities contained in the second interlayer insulating film 9 from diffusing and reaching the gate electrode 17. The second interlayer insulating film 9 is preferably 400 nm to 800 nm thick so that the rounded upper corners and ridges can relax concentrations of stress.

There are provided contact holes 21 that penetrate the first interlayer insulating film 8 and the second interlayer insulating film 9 in the depth direction and that reach the respective n⁺ source regions 4 and p⁺ contact regions 5. The upper corners and ridges that define the contact holes 21 are rounded, as described above.

Source contact electrodes 10 for ohmic contact are formed on surfaces of the n⁺ source regions 4 and the p⁺ contact regions 5 that have been exposed by the contact holes 21. The source contact electrodes 10 are a nickel silicide (NiSi) layer with a thickness of about 20 mm to about 100 nm, for example.

A barrier film 11 is formed so as to be in contact with the source contact electrodes 10 and the second interlayer insulating film 9. The barrier film 11 is, for example, a Ti film. A front surface electrode 12 having Al as the main component is formed so as to be in contact with the barrier film 11. Together with the front surface electrode 12, the barrier film 11 functions as a source wiring. The thickness of the barrier film 11 is, for example, equal to or greater than 10 nm and equal to or less than 1.0 μm so as to effectively shield and absorb hydrogen atoms and hydrogen ions or the like generated in the front surface electrode 12 and to avoid cracking. Here, the "hydrogen atoms and hydrogen ions or the like" mean any particles made of hydrogen atoms as the smallest constituent elements, and more specifically, hydrogen atoms, hydrogen ions, and hydrogen molecules. The thickness of the front surface electrode 12 is equal to or greater than 1 μm and less than or equal to 10 μm in order to mitigate partial loss or abrasion due to plating or wire-bonding.

By providing the barrier film 11 between the second interlayer insulating film 9 and the front surface electrode 12, it is possible to prevent hydrogen atoms and hydrogen ions or the like generated in the front surface electrode 12 from intruding into the gate insulating film 6 and to the interface between the gate insulating film 6 and the p well region 3 (the SiO$_2$/SIC interface, hereinafter) through the first interlayer insulting film 8, the second interlayer insulating film 9, and the gate electrode 17. Because of this, generation of positive charges that would occur due to the hydrogen atoms and hydrogen ions or the like being trapped at or near the SiO$_2$/SiC interface can be suppressed, and thereby the threshold voltage shifts can be suppressed.

The entire bottom surface of the front surface electrode 12 is in contact with the barrier film 11. Here, the edges of the front surface electrode 12 may be located on inner sides relative to the edges of the barrier film 11. By locating the edges of the front surface electrode 12 on inner sides relative to the edges of the barrier film 11, the hydrogen shielding effects of the barrier film 11 can be further enhanced. The front surface electrode 12 is electrically connected to the n⁺ source region 4 and to the p⁺ contact region 5 through the barrier film 11 and the source contact electrode 1. Here, it is not mandatory to have the edges of the front surface electrodes 12 located on inner sides relative to the edges of the barrier film 11; these edges maybe located at the same places.

A passivation protection film 13 is provided in order to cover the front surface electrode 12 and the barrier film 11 not covered by the front surface electrode 12. The passivation protection film 13 is made of polyimide, for example. The passivation protection film 13 has an opening 41 for connecting a wiring to the front surface electrode 12. The size of the opening 41 may be selected as appropriate.

On a surface of the n⁺ silicon carbide substrate 1 on a side opposite to the n⁻ drift layer 2, a back surface electrode 14 is disposed to establish ohmic contact. The back surface electrode 14 may be an NiSi layer. A laminate film, such as Ti, nickel (Ni), and gold (Au), may be disposed on the surface of the back surface electrode 14.

Manufacture Method of Silicon Carbide
Semiconductor Device of Embodiment 1

A method of manufacturing the silicon carbide semiconductor device of Embodiment 1 will be explained with reference to FIGS. 2 to 6.

Figure 2:
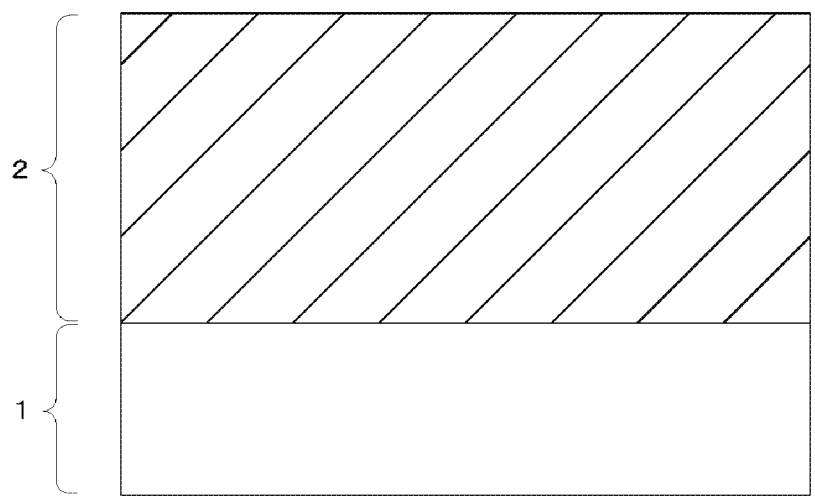
FIG. 2 schematically shows a first part of a manufacture method of the silicon carbide semiconductor device of Embodiment 1.

First, a four-layer periodic hexagonal (4H) $n^+$ silicon carbide substrate 1 doped with n-type impurities, such as nitrogen, at a high concentration is prepared. An $n^-$ drift layer 2 is then epitaxially grown on the front surface of the $n^+$ silicon carbide substrate 1. The nitrogen concentration of the $n^-$ drift layer 2 may be $5 \times 10^{15}$ cm$^{-3}$ to $1 \times 10^{16}$ cm$^{-3}$, and the thickness thereof may be 5 μm to 20 μm, for example. FIG. 2 shows this state.

Next, p well regions 3 are selectively formed in a surface of the $n^-$ drift layer 2 by ion implantation. The impurity concentration of the p well regions may be about $1 \times 10^{17}$ cm$^{-3}$ to about $1 \times 10^{19}$ cm$^{-3}$, for example. Then, an $n^+$ source region 4 is selectively formed in a surface of each p well region 3 by ion implantation. Further, next to the $n^+$ source region 4, a $p^+$ contact region 5 is selectively formed in a surface of each p well region by ion implantation. In more detail, a mask (made of silicon oxide, for example) for ion implantation that has openings in locations corresponding to the p well regions 3 is formed, and prescribed ions are injected by ion implantation at a prescribed ion acceleration energy with a prescribed dose. Then, the mask for ion implantation is removed. Thereafter, a mask (made of silicon oxide, for example) for ion implantation that has openings in locations corresponding to the $n^+$ source regions 4 is formed, and prescribed ions are injected by ion implantation at a prescribed ion acceleration energy with a prescribed dose. Then, the mask for ion implantation is removed. Thereafter, a mask (made of silicon oxide, for example) for ion implantation that has openings in locations corresponding to the $p^+$ contact regions 5 is formed, and prescribed ions are injected by ion implantation at a prescribed ion acceleration energy with a prescribed dose. Then, the mask for ion implantation is removed. The order of these steps may be altered as desired. As the ion-implanted impurities, phosphorus ions or N ions may be used for forming n-type regions, and Al ions may be used for forming p-type regions.

Figure 3:
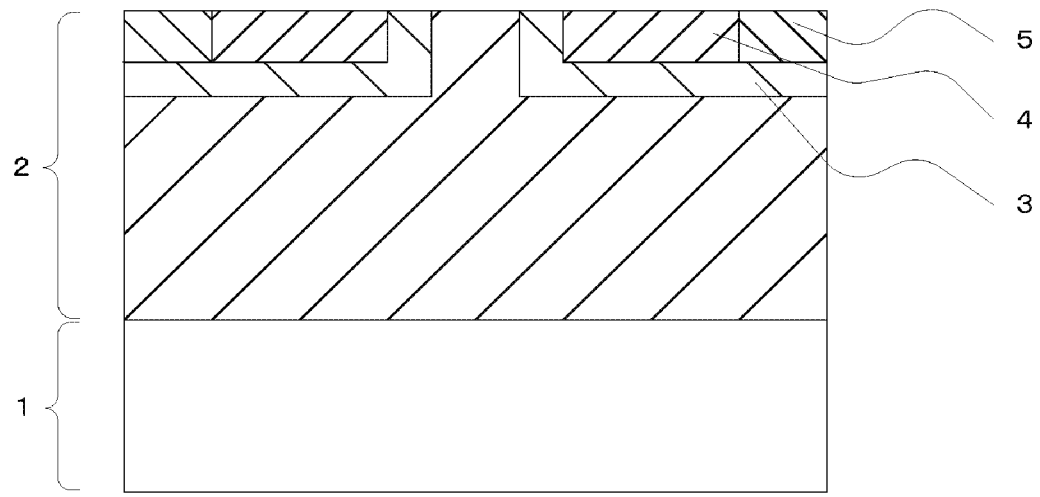
FIG. 3 schematically shows a second part of the manufacture method of the silicon carbide semiconductor device of Embodiment 1.

Next, annealing is performed at a temperature of 1700° C. in an inert gas atmosphere, such as argon (Ar) atmosphere to activate impurities that have been ion-implanted. The duration of the annealing is appropriately adjusted in order to ensure sufficient activation without causing unnecessary diffusions. FIG. 3 shows this state.

Then, a gate insulating film 6 is formed on the surfaces of the p well regions 3 and the $n^-$ drift layer 2. Here, the gate insulating film 6 is made of a silicon oxide film formed by thermal oxidation or CVD method. The gate insulating film 6 is about 20 nm to about 120 nm thick, for example, 60 nm thick. The gate insulating film 6 may be subject to a nitriding treatment.

Figure 4:
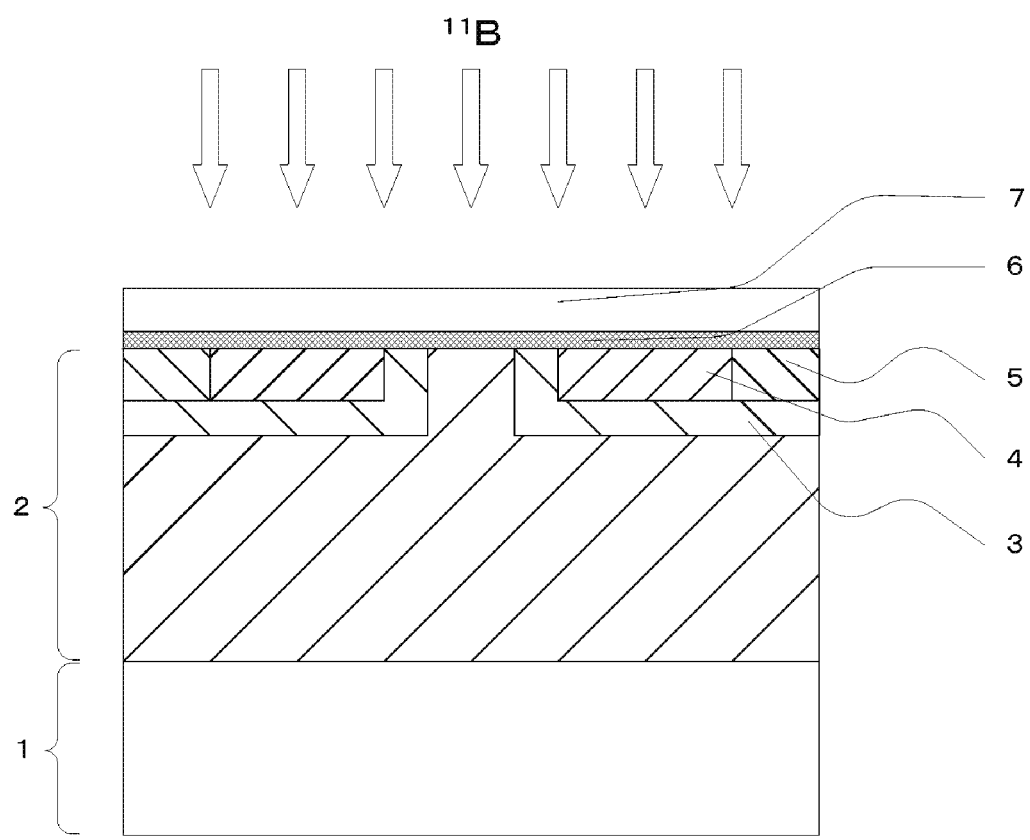
FIG. 4 schematically shows a third part of the manufacture method of the silicon carbide semiconductor device of Embodiment 1.
Figure 5:
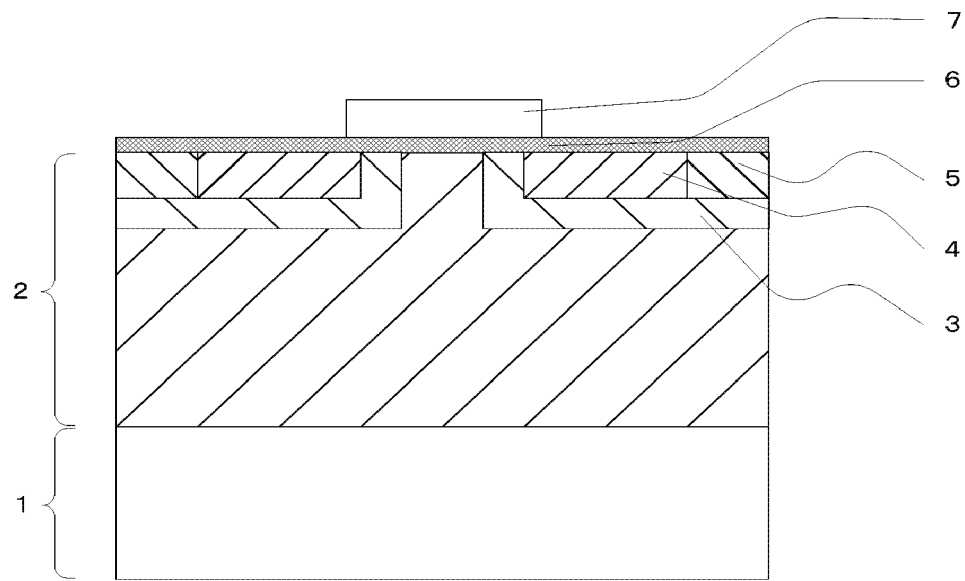
FIG. 5 schematically shows a fourth part of the manufacture method of the silicon carbide semiconductor device of Embodiment 1.

Next, a gate electrode 17 is formed on the surfaces of the p well regions 3 and the $n^-$ drift layer 2 with the gate insulating film 6 interposed therebetween. The gate electrode 17 is formed of $p^+$ polysilicon doped with $^{11}$B. To form the gate electrode 17, first, a non-doped polysilicon film 7 is formed by the CVD method. Then, only $^{11}$B, which is one of the isotopes of boron, is selectively ion-implanted into the non-doped polysilicon film 7 using a mass-spectroscopy magnet of an ion-implantation apparatus. FIG. 4 shows this state. Thereafter, the polysilicon film 7 is processed into a prescribed pattern that covers the p well regions 3 and the $n^-$ drift layer 2 by photolithography and etching. This way, the patterned polysilicon film 7 in which only $^{11}$B has been selectively doped has been formed. FIG. 5 shows this state. Then, the patterned polysilicon film 7 in which only $^{11}$B has been selectively doped undergoes a thermal treatment to diffuse and activate $^{11}$B, thereby forming the gate electrode 17. The $^{11}$B concentration in the gate electrode 17 is preferably in a range of about $3 \times 10^{19}$ cm$^{-3}$ to about $2 \times 10^{21}$ cm$^{-3}$, for example. The thermal treatment(s) for activating and/or diffusing $^{11}$B in the polysilicon film 7, which forms the gate electrode 17, may be performed at appropriate timing. For example, it may be performed immediately after ion implantation on the polysilicon film 7, or may be performed after forming a pattern of the polysilicon film 7. Or, it may be performed during another thermal treatment process performed later during the manufacture, such as a reflow process for a second interlayer insulating film 9. In this embodiment, this thermal treatment for the polysilicon film 7 is performed during the reflow process for the second interlayer insulating film 9. Also, in this embodiment, ion implantation is used to selectively dope $^{11}$B only into the polysilicon forming the gate electrode 17. However, the doping method is not limited to ion implantation.

Next, NSG is formed by the CVD method so as to cover the polysilicon film 7 as a first interlayer insulating film 8. Also, BPSG is formed so as to cover the first interlayer insulating film 8 as the second interlayer insulating film 9.

Then, contact holes 21 that penetrate the first interlayer insulating film 8 and the second interlayer insulating film 9 in the depth direction are formed by photolithography and etching. The contact holes 21 expose the respective $n^+$ source regions 4 and the respective $p^+$ contact regions 5. Then the upper corners and ridges of the second interlayer insulating film 9 are rounded by a reflow process. The reflow process is performed at a temperature of about 750° C. to about 1100° C., for about 10 min to about 30 min in an inert gas atmosphere, such as argon atmosphere or in an oxygen atmosphere. During this reflow process, $^{11}$B that has been ion-implanted into the polysilicon film 7 is activated and diffused, thereby forming the gate electrode 17. At the same time, although in a minute amount, $^{11}$B is diffused from the gate electrode 17 to the gate insulating film 6.

Figure 6:
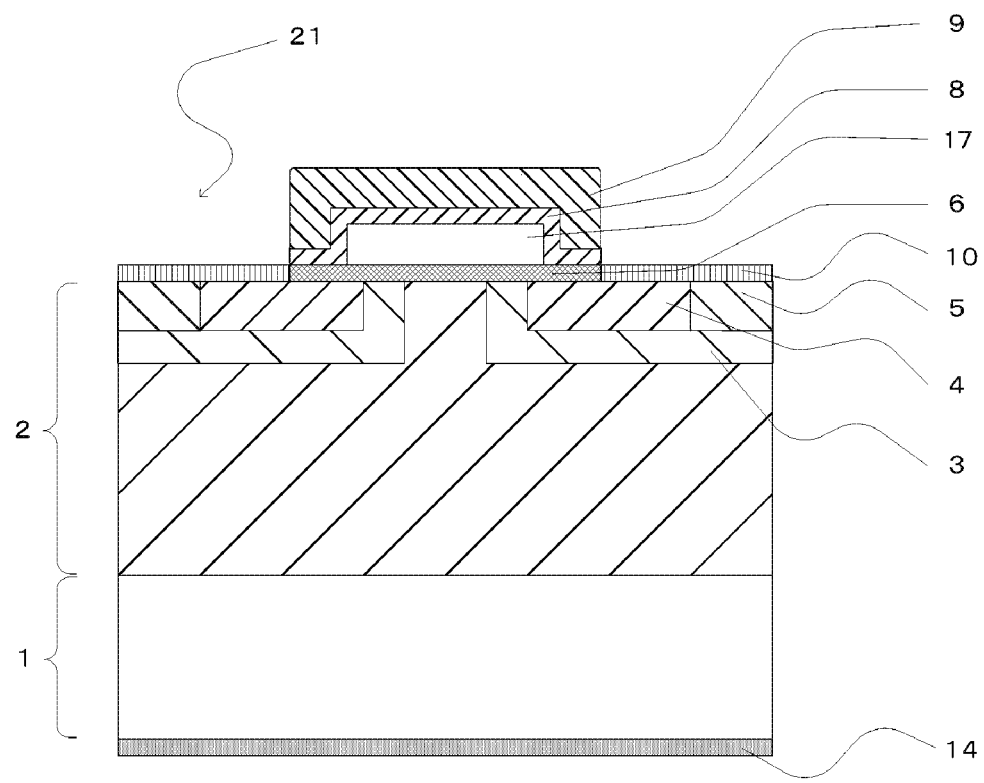
FIG. 6 schematically shows a fifth part of the manufacture method of the silicon carbide semiconductor device of Embodiment 1.

Next, source contact electrodes 10 are formed. Each source contact electrode 10 makes ohmic contact with both of the $n^+$ source region 4 and the $p^+$ contact region 5, which are exposed inside the contract hole 21. The source contact electrode 10 is, for example, an NiSi layer. To form the source contact electrodes 10, a Ni film is formed on the surfaces of the $n^+$ source regions 4 and the $p^+$ contact regions 5 by sputtering, and the Ni film is patterned by photolithography and etching so that the resulting Ni patterns cover the $n^+$ source regions 4 and the $p^+$ contact regions. Further, a Ni film is formed on the back surface so as to make ohmic contact with the back surface side as an back surface electrode 14. The Ni film is, for example, about 20 nm to about 100 nm thick. Then a heat treatment is performed by the RTA (Rapid Thermal Annealing) method in an inert gas atmosphere or a low pressure atmosphere at a temperature of about 1000° C. so that the Ni film reacts with SiC of the substrate, thereby forming the source contact electrodes 10 and the back surface electrode 14, both made of NiSi. FIG. 6 shows this state. Here, the material for the source contact regions 10 and the back surface electrode 14 is not limited to Ni. A material that can form a silicide, such as an alloy of Al and Ni, Ti, tantalum (Ta), molybdenum (Mo), for example, may be used instead. If the back surface electrode 14 is formed by laser annealing, the back surface electrode 14 may be formed after forming the polyimide film. Moreover, the n⁺ silicon carbide substrate 1 may be made thinner by grinding or the like before the formation of the back surface electrode 14.

Next, a barrier film 11 and a front surface side electrode 12 are formed by sputtering so as to cover the source contact regions 10 and the second interlayer insulating film 9. As the barrier film 11, a Ti film is be used, for example. As the front surface electrode 12, an Al film is used, for example. The barrier film 11 together with the front surface electrode 12 functions as a source wiring. The barrier film 11 absorbs and stores hydrogen (H) atoms and hydrogen ions or the like generated in the front surface electrode 12, and prevents them from reaching layers thereunder.

The Ti film of the barrier film 11 and the Al film of the front surface electrode 12 are preferably formed successively without exposing them to an external atmosphere during the film formation. By successively forming the barrier film 11 and the front surface electrode 12 this way, oxidation of the surface of the Ti film of the barrier film 11 can be prevented and the barrier function is expected to last for a long time. The barrier film 11 is preferably about 10 nm to about 1 μm thick, for example, so that it can sufficiently absorb and block hydrogen, that cracks are unlikely to occur, and that working on it is easy.

The front surface electrode 12 may be formed of Al that contains impurities, such as Si of copper (Cu), in order to prevent deterioration due to electric current. The front surface electrode 12 is formed so as to be electrically connected to the n⁺ source regions 4 and the p⁺ contact regions 5 through the barrier film 11 and the source contact electrodes 10. The thickness of the front surface electrode 12 is 1 μm to 10 μm thick so as to mitigate partial loss or abrasion thereof due to plating or wire-bonding.

A patterning of the front surface electrode 12 is then performed by photolithography and etching. Next, the barrier film 11 is patterned by photolithography and etching. By performing the patterning of the front surface electrode 12 and the patterning of the barrier film 11 separately, the entire bottom surface of the front surface electrode 12 is made in contact with the barrier film 1, and the edges of the front surface electrode 12 are formed in an area smaller than the area of the barrier film 11. This way, the shielding effects of the barrier film 11 against hydrogen (H) atoms and hydrogen ions or the like can be further enhanced.

Next, a polyimide film 13 is formed to a thickness of 1 μm to 20 μm so as to cover the front surface electrode 12 and the barrier film 11. An opening part 41 is formed in the polyimide film 13 by photolithography in order for an external wiring to be connected thereto. Here, in order to improve the reliability, an laminate film of Ti and Au may be formed on the surface of the back surface electrode 14 by vacuum evaporation.

Embodiment 2

Figure 7:
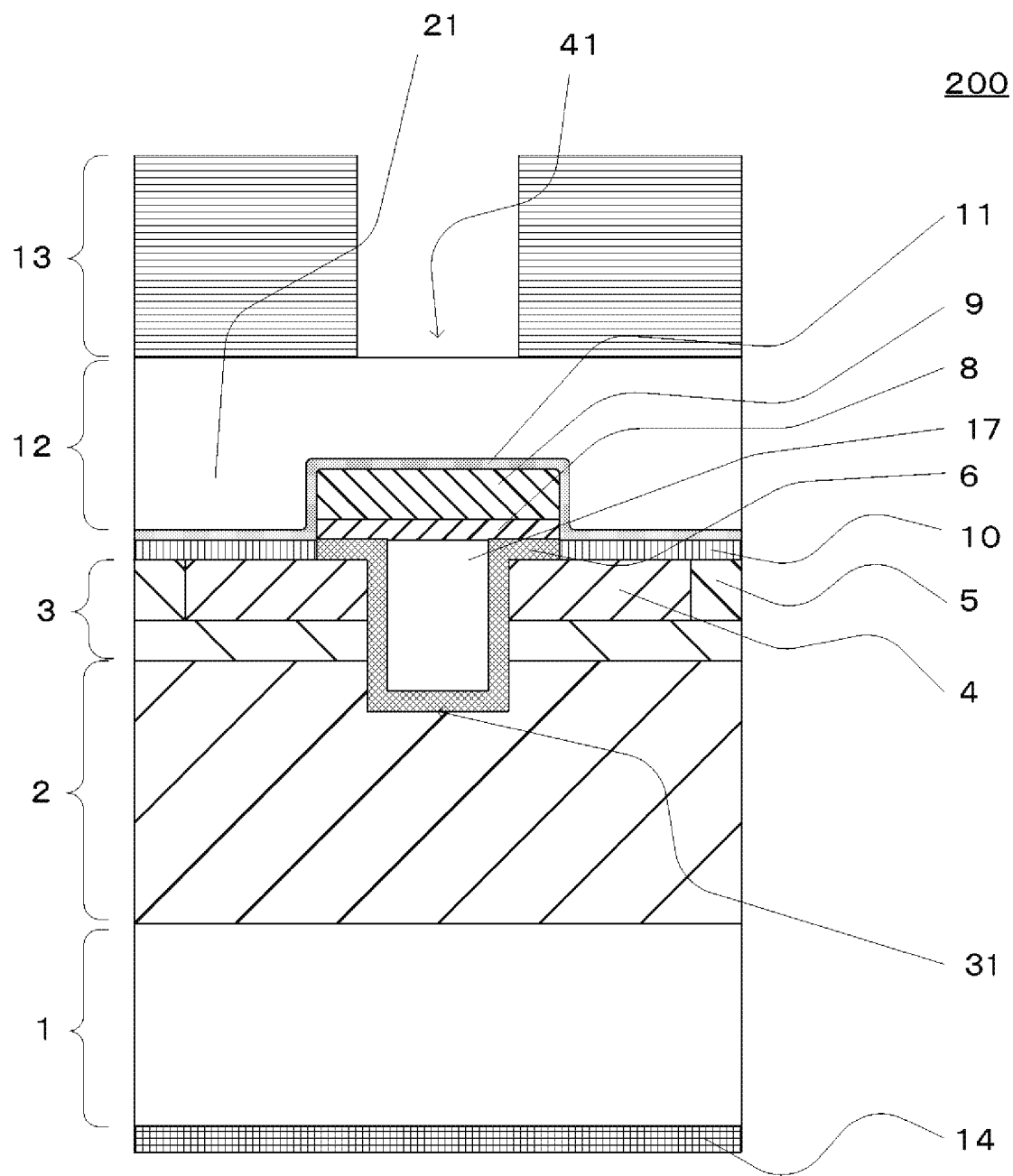
FIG. 7 is a schematic cross-sectional view of main parts of a silicon carbide semiconductor device according to Embodiment 2 of the present invention.

Embodiment 2 of the present invention is an example where the concept of Embodiment 1 is applied to a trench gate MOSFET. Embodiment 2 differs from Embodiment 1 in that the MOSFET is a trench gate type. Other than that, Embodiment 2 is same as Embodiment 1. FIG. 7 is a cross-sectional view schematically showing main parts of a trench gate type MOSFET 200 according to Embodiment 2 of the present invention. FIG. 7 shows a unit cell in the active region where current drive is performed. Other cells that are repeatedly arranged adjacent to this cell and a voltage withstand structure that surrounds the periphery of the active region are omitted.

A drain region of the trench gate type MOSFET 200 is made of an n⁺ silicon carbide substrate 1. The n⁺ silicon carbide substrate 1 is, for example, a four-layer periodic hexagonal (4H) single crystal silicon carbide substrate doped with nitrogen (N) at a high concentration.

In a front surface of the n⁺ silicon carbide substrate 1, an n⁻ drift layer 2 is provided. The n⁻ drift layer 2 is, for example, a silicon carbide layer doped with N. The impurity concentration in the n⁻ drift layer 2 is lower than that in the n⁺ silicon carbide substrate 1.

On the surface side of the n⁻ drift layer 2, a MOS (Metal-Oxide-Semiconductor) structure is provided. Specifically, in a surface of the n⁻ drift layer 2, p well regions 3 (a first semiconductor region of a second conductivity type) are formed. In a surface of each p well region, an n⁺ source region 4 (a second semiconductor region of the first conductivity type) is selectively formed. Also, in a surface of each p well region 3, next to the n⁺ source region 4, a p⁺ contact region 5 that has a higher impurity concentration than the p well region 3 is selectively formed. Here, as impurities for controlling the conductivity type for the regions 3 to 5, phosphorus (P) or nitrogen (N) is doped in the n-type regions, and aluminum (Al) is doped in the p-type region.

A trench 31 is provided to penetrate the n⁺ source regions 4 and the p well regions 3, reaching the n⁻ drift layer 2. At the bottom of trench 31 in the n⁻ drift layer 2, a p-type region for electric filed relaxation may be provided. The sidewalls of the trench may be the m-plane or the a-plane of silicon carbide single crystal.

A gate electrode 17 is embedded inside the trench 31 with a gate insulating film 6 interposed in between. The gate insulating film 6 is made of silicon oxide. The gate insulating film 6 may include nitrogen. Similar to Embodiment 1, the gate electrode 17 is made of polysilicon doped with $^{11}$B. This completes the MOS structure.

Like Embodiment 1, this embodiment aims to dope only $^{11}$B (an isotope with a mass number of 11) in the polysilicon that constitutes the gate electrode 17. In reality, a minute amount of $^{10}$B (an isotope with a mass number of 10) will be included. Thus, as in Embodiment 1, the content of $^{11}$B is set to at least 90% of the entire boron impurities contained in the polysilicon of the gate electrode 17. It is more preferable to have at least 95% of the $^{11}$B content in the entire boron impurities. Further, the concentration of $^{10}$B in the polysilicon of the gate electrode 17 is preferably equal to or less than $1.0 \times 10^{17}$ cm$^{-3}$. Also, the concentration of $^{10}$B in the gate insulating film 6 at a position 10 nm deep inside from the interface of the gate electrode 17 and gate insulting film 6 is preferably equal to or less than $1.5 \times 10^{17}$ cm$^{-3}$. The impurity area concentration of $^{10}$B in the gate insulating film 6 is preferably $2.5 \times 10^{14}$ cm$^{-2}$ or less.

On the gate electrode 17, an interlayer insulting film that covers the gate electrode 17 is provided. The interlayer insulating film has a laminate structure having a first interlayer insulating film 8 in contact with the gate electrode 17 and a second interlayer insulating film 9 that covers the first interlayer insulating film 8. The first interlayer insulating film 8 is an insulating film that does not contain boron as its impurities, and is made of NSG, for example. The second interlayer insulating film 9 is an insulating film that contains boron and/or phosphorus impurities, and is made of BPSG, for example. Here, in order to prevent the boron or phosphorus impurities from diffusing and reaching the gate electrode 17, the first interlayer insulating film 8 is preferably 100 nm to 300 nm thick. Further, in order to provide for rounded upper corners and ridges, the second interlayer insulating film 9 is preferably 400 nm to 800 nm thick.

Contact holes 21 are provided to penetrate the first interlayer insulating film 8 and the second interlayer insulating film 9 in the depth direction and to reach the $n^+$ source regions 4 and the $p^+$ contact regions 5. As described above, the upper corners and ridges of the second interlayer insulating film 9 that define the contact holes 21 are rounded.

The source contact electrodes 10, the back surface contact electrode 14, the barrier films 11 and the front surface electrode 12, and the passivation protection film 13 in this embodiment are same or similar to those of Embodiment 1, and therefore, detailed explanations thereof are omitted.

Manufacture Method of Silicon Carbide
Semiconductor Device of Embodiment 2

Figure 8:
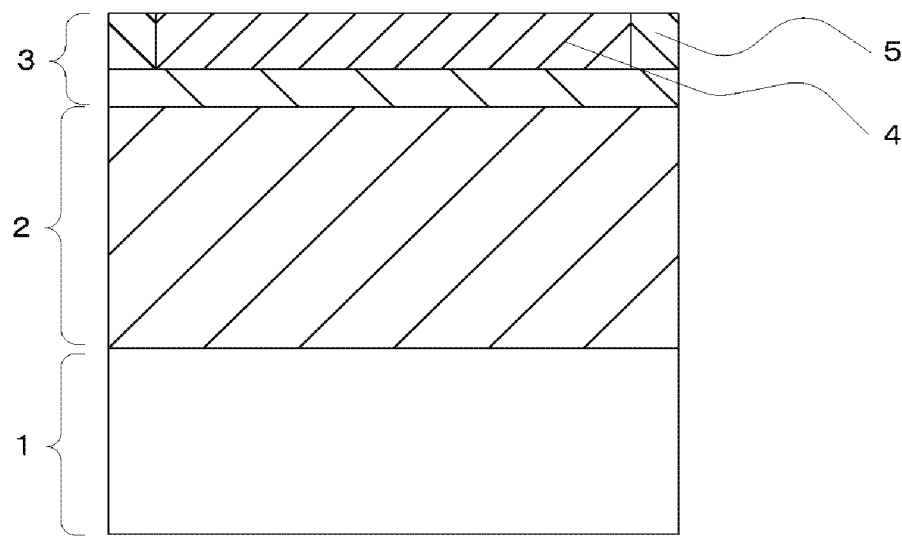
FIG. 8 schematically shows a first part of a manufacture method of the silicon carbide semiconductor device of Embodiment 2.
Figure 9:
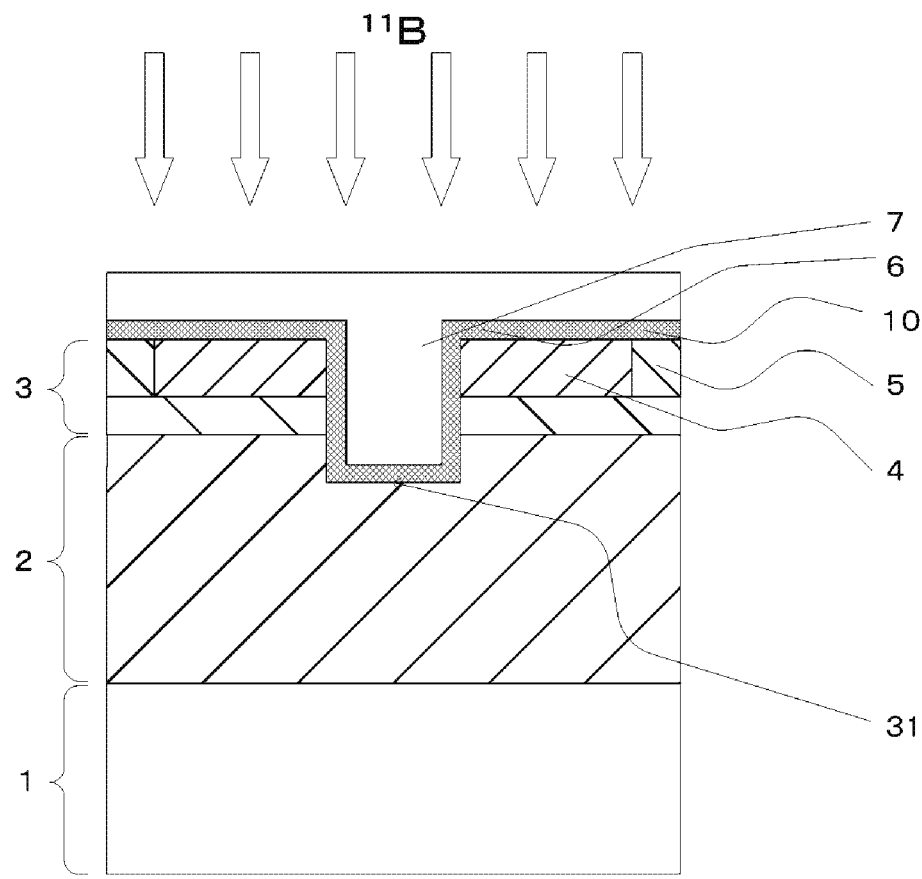
FIG. 9 schematically shows a second part of the manufacture method of the silicon carbide semiconductor device of Embodiment 2.
Figure 10:
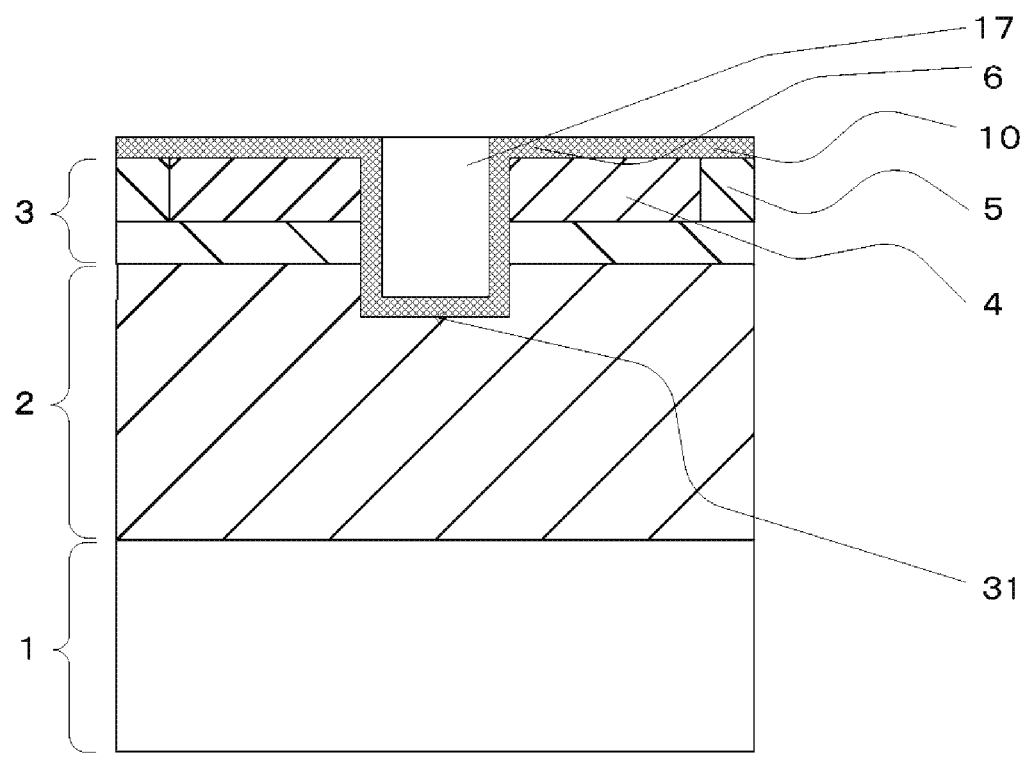
FIG. 10 schematically shows a third part of the manufacture method of the silicon carbide semiconductor device of Embodiment 2.

A method of manufacturing a silicon carbide semiconductor device according to Embodiment 2 will be explained with reference to FIGS. 8 to 10 in the case of making a trench gate MOSFET.

First, a four-layer periodic hexagonal (4H) $n^+$ silicon carbide substrate 1 doped with n-type impurities, such as nitrogen, at a high concentration is prepared. An $n^-$ drift layer 2 is then epitaxially grown on the front surface of the $n^+$ silicon carbide substrate 1. The nitrogen concentration of the $n^-$ drift layer 2 may be about $5\times10^{15}$ $cm^{-3}$ to about $1\times10^{16}$ $cm^{-3}$, and the thickness thereof may be about 5 μm to about 20 μm, for example. Next, a p well region 3 is epitaxially grown on the front surface of the $n^-$ drift layer 2. The p-type impurity (such as Al) concentration in the p well region may be about $1\times10^{17}$ $cm^{-3}$ to about $1\times10^{19}$ $cm^{-3}$, for example, and the thickness of the p well region may be about 1 μm to about 10 μm, for example.

Then, an $n^+$ source region 4 is selectively formed in a surface of the p well region 3 by ion implantation. Further, next to the $n^+$ source region 4, $p^+$ contact regions 5 are selectively formed in a surface of the p well region 3 by ion implantation. In more detail, to form the $n^+$ source region 4, a mask (made of silicon oxide, for example) for ion implantation that has an opening in a location corresponding to the $n^+$ source region 4 is formed; prescribed ions are injected by ion implantation at a prescribed ion acceleration energy with a prescribed dose; and then the mask for ion implantation is removed. To form the $p^+$ contact regions 5, a mask (made of silicon oxide, for example) for ion implantation that has openings in locations corresponding to the $p^+$ contact regions 5 is formed; prescribed ions are injected by ion implantation at a prescribed ion acceleration energy with a prescribed dose; and then the mask for ion implantation is removed. As the ion-implanted impurities, phosphorus ions or N ions may be used for forming n-type regions, and Al ions may be used for forming p-type regions. The order of these steps for forming the $n^+$ region 4 and the $p^+$ contact regions 5 may be altered as appropriate. FIG. 8 shows the structure up to this manufacturing step.

Then, annealing is performed at a temperature of 1700° C. in an inert gas atmosphere, such as argon (Ar) atmosphere, to activate impurities that have been ion-implanted. The duration of the annealing is appropriately adjusted in order to ensure sufficient activation without causing unnecessary diffusions.

Then, a trench 31 that penetrates the $n^+$ source region 4 and the p well region 3 and that reaches the $n^-$ drift layer 2 is formed. The trench 31 is formed by anisotropic dry etching. When process damages exist on sidewalls of the trench 31, the process damages are removed by sacrificial oxidation, isotropic etching, or annealing in a hydrogen atmosphere, or by a treatment combining these processes. A p-type region may be selectively formed at the bottom of the trench in the $n^-$ drift layer 2 by ion implantation for electric field relaxation. The sidewalls of trench 31 may be the m-plane or the-plane of silicon carbide single crystal.

A gate insulating film 6 is formed inside the trench 31. The gate insulating film 6 is made of a silicon oxide layer formed by the CVD method or thermal oxidation. The gate insulating film 6 is about 20 nm to about 120 nm thick, for example, 60 nm thick. The gate insulating film 6 may be subject to a nitriding process.

Next, a gate electrode 17 is formed. First, a non-doped polysilicon film 7 is formed on a surface of the gate insulating film 6 by the CVD method. Then, only $^{11}B$ is selectively ion-implanted into the non-doped polysilicon film 7. FIG. 9 shows this state. A thermal treatment is then performed to activate $^{11}B$ in the polysilicon film 7 and diffuse $^{11}B$ into the polysilicon inside the trench. Thereafter, the polysilicon film 7 undergoes an etching step to leave only the polysilicon inside the trench and remove the polysilicon film 7 on the front surface, thereby forming the gate electrode 17. FIG. 10 shows this state. Additional diffusion may be applied to $^{11}B$ in the polysilicon that forms the gate electrode 17 during the subsequent manufacturing steps, such as a reflow process.

Next an interlayer insulating film that covers the gate electrode 17 is formed by the CVD method. The interlayer insulating film has a laminate structure; first a first interlayer insulating film 8 that covers the gate electrode 17 is formed, and then a second interlayer insulating film 9 that covers the first interlayer insulating film 7 is formed. The first interlayer insulating film 7 is NSG, for example. The second interlayer insulating film 9 is BPSG, for example.

Then, contact holes 21 that penetrate the first interlayer insulating film 8 and the second interlayer insulating film 9 in the depth direction and that reach the $n^+$ source regions 4 and the $p^+$ contact regions 5 are formed by photolithography and etching. The upper corners and ridges of the second interlayer insulating film 9 that define the contact holes 21 are rounded by a reflow process. The reflow process is performed at a temperature of about 750° C. to about 1100° C., for about 10 min to about 30 min in an inert gas atmosphere, such as argon atmosphere or in an oxygen atmosphere. The first interlayer insulating film 8 prevents the boron and phosphorus impurities in the second interlayer insulating film 9 from diffusing into the gate electrode 17. During this reflow process, $^{11}B$ in the polysilicon film that constitutes the gate electrode 17 diffuses. At the same time, although in a minute amount, $^{11}B$ in the gate electrode 17 is diffused into the gate insulating film 6.

Manufacture steps of the source contact electrodes 10, the barrier film 11, the front surface electrode 12, the back surface electrode 14, and the polyimide film 13 are same or similar to those of Embodiment 1, and therefore, explanations thereof are omitted.

Working Example 1

In accordance with the above-described manufacture method of the silicon carbide semiconductor device of Embodiment 1, a planar gate MOSFET was manufactured as Working Example 1. Specifically, an $n^-$ drift layer 2 was epitaxially gown on a front surface of an $n^+$ silicon carbide substrate 1. The $n^-$ drift layer 2 had a nitrogen concentration of $2\times10^{15}$ cm$^{-3}$ and was 15 µm thick. Then, a mask for ion implantation made of silicon oxide was formed on the n$^-$ drift layer 2, and Al ions were ion-implanted thereto at 500° C. to form p well regions 3. The dose was set to $1\times10^{16}$ cm$^{-3}$ and the injection depth was 1 µm. Thereafter, a mask for ion implantation made of silicon oxide was formed on surfaces of the p well regions 3, and Al ions were ion-implanted to form p$^+$ contact regions 5. The dose for the p$^+$ contact regions 5 was set to $1\times10^{18}$ cm$^{-3}$.

Then, a mask for ion implantation made of silicon oxide that has openings next to the p$^+$ contact regions 5 was formed on surfaces of the p well regions 3, and phosphorus ions were ion-implanted to form n$^+$ source regions 4. The dose for the n$^+$ source region 4 was set to $1\times10^{19}$ cm$^{-3}$.

An annealing process was performed in an annealing furnace in an argon atmosphere at 1700° C. for 5 min to activate the ion-implanted impurities. Then, a thermal oxidation process was performed in an oxidization furnace in an atmosphere including water vapor (H$_2$O) at 1200° C. so as to form a silicon oxide film that becomes a gate insulating film 6 on the surface of the n$^-$ drift layer 2. The thickness of the silicon oxide film was set to 60 nm.

A non-doped polysilicon film 7 (i.e., not doped with any impurities) was formed on the gate insulating film 6 by the CVD method to a thickness of 0.5 µm. Thereafter, $^{11}$B was doped into the polysilicon film 7 by ion implantation. An annealing process was performed in an annealing furnace to activate and diffuse $^{11}$B in the polysilicon film 7. The polysilicon film 7 was then patterned by photolithography and etching to form the gate electrode 17.

Next, a first interlayer insulating film 8 was formed by the CVD method so as to cover the gate electrode 17. The first interlayer insulating film 8 was made of NSG and was set to 200 nm thick. Then, a second interlayer insulating film 9 was formed by the CVD method so as to cover the first interlayer insulating film 8. The first interlayer insulating film 9 was made of BPSG and was set to 600 nm thick. Thereafter, contact holes 21 that penetrate the first interlayer insulating film 8 and the second interlayer insulating film 9 and that reach the respective n$^+$ source regions 5 and p$^+$ contact electrodes 6 were formed by photolithography and etching. A reflow process was performed in an argon atmosphere at 1000° C. for 30 min so as to round the upper corners and ridges of the second interlayer insulating film 9. During this thermal process, $^{11}$B in the polysilicon that becomes the gate electrode 17 diffused and were activated.

An Ni film having a thickness of 60 nm was formed inside the contact holes 21 by sputtering, and were patterned by photolithography and etching so that the Ni film remains in the source contact regions 10. Then, an Ni film was formed on the back surface of the n$^+$ silicon carbide substrate 1.

Next, the resulting substrate was held in an RTA furnace in an nitrogen atmosphere for 5 min to make the Ni film a silicide, thereby forming the source contact electrodes 10 and the back surface electrode 14 for ohmic contact.

Then, a Ti film of 100 nm thick and an Al film of 5 µm thick were successively formed in the same sputtering apparatus. The Al film was pattered by photolithography and etching to form the front surface electrode 12. The Ti film was patterned by photolithography and wet-etching to form the barrier film 11 that has about 3 µm outwardly larger than the area of the front surface electrode 12.

Polyimide was then coated to a thickness of 10 µm, and was patterned by photolithography to form a polyimide film 13. Thereafter, on the back surface electrode 14, a Ti film of 100 nm thick and a gold (Au) film of 200 nm thick were formed by vapor evaporation. This way, a planar gate MOSFET in which the polysilicon of the gate electrode 17 selectively contains only $^{11}$B was manufactured.

Comparison Example 1

A planar gate MOSFET in which the polysilicon of the gate electrode 17 contains $^{11}$B and $^{10}$B at the natural abundance ratio (80.1%:19.9%) was manufactured as Comparison Example 1. The manufacture method was same as the planar gate MOSFET of Working Example 1 except for the formation of the gate electrode 17, and therefore, their descriptions are omitted here. The gate electrode 17 of Comparison Example 1 was formed by forming a p$^+$ polysilicon film 7 on the gate insulating film 6 by the CVD method using monosilane (SiH$_4$) and diborane (B$_2$H$_6$) and by pattering it. This way, the polysilicon of the gate electrode 17 contained $^{11}$B and $^{10}$B at the natural abundance ratio (80.1%:19.9%).

Working Example 2

In accordance with the above-described manufacture method of the silicon carbide semiconductor device of Embodiment 2, a trench gate MOSFET device was manufactured as Working Example 2. Specifically, an n$^-$ drift layer 2 and a p well region 3 were epitaxially grown on a n$^+$ silicon carbide substrate 1. The n$^-$ drift layer 2 had a nitrogen concentration of $2\times10^{15}$ cm$^{-3}$ and was 15 µm thick. The p well region 3 was doped with Al and was 2.0 µm thick. Then, by forming a mask for ion implantation on a front surface of the p well region 3 and by ion-implanting phosphorus ions, an n$^+$ source region 4 was selectively formed. In a front surface of the p well region 3, next to the n$^+$ source region 4, a mask for ion implantation was formed and Al ions were ion-implanted so that p$^+$ contact regions 5 were selectively formed. Annealing was then performed in an annealing furnace in an argon atmosphere at 1700° C. to activate the impurities that have been ion-implanted. Thereafter, a trench 13 that penetrates the n$^+$ source region 4 and the p-well region 3 and that reaches the n$^-$ drift layer 2 was formed by photolithography and dray-etching. The trench 31 had a stripe shape. The sidewalls of the trench 31 were the m-plane of silicon carbide single crystal, and the width of the trench 31 was set to about 1 µm. Thereafter, sacrificial oxidation was performed to remove areas of process damages in the trench 31.

A gate insulating film 6 was formed on inner surfaces of the trench 31 and on surfaces of the n$^+$ source regions 4 by the CVD method. The gate insulating film 6 was made of an HTO (High Temperature Oxide) film having a thickness of about 60 nm. The gate insulating film 6 was subject to a nitriding thermal process in an annealing apparatus in an atmosphere of nitrogen monoxide at 1300° C. for 30 min. Thereafter, a non-doped polysilicon film 7, which was not doped with any impurities, was formed on the gate insulating film 6 by the CVD method so as to fill in the trench 31. Then, in the polysilicon film 7, only $^{11}$B ions were selectively doped by ion implantation at a high concentration. A thermal treatment was then performed in an annealing apparatus to activate and diffuse $^{11}$B in the polysilicon film 7. The resultant polysilicon film 7 was etched by dry etching from the top surface to form the gate electrode 17 that is embedded in the trench 31. Thereafter, a first interlayer insulating film 8 made of NSG with a thickness of 200 nm to cover the gate electrode 17 and a second interlayer insulting film 9 made of BPSG with a thickness of 600 nm to cover the first interlayer insulating film 8 were formed.

Subsequently, contact holes 21 that penetrate the first interlayer insulating film 8 and the second interlayer insulating film 9 in the depth direction and that reach the n$^+$ source contact regions 3 and the p$^+$ contact regions 5 were formed by photolithography and etching. The upper corners and ridges of the second interlayer insulating film 9 that define the contact holes 21 were rounded by a flow process. During this reflow process, $^{11}$B in the gate electrode 17 made of polysilicon diffused, making the impurity distribution uniform.

Thereafter, in the contact holes 21, a Ni film was formed to a thickness of 60 nm by sputtering, and was patterned by photolithography and etching so that the Ni film remained in the source contact regions 10. Then, a Ni film was formed on the back surface of the n$^+$ silicon carbide substrate 1. The resulting substrate was held in an RTA furnace in a nitrogen atmosphere for 5 minutes to make the Ni films silicide, thereby forming the source contact electrodes 10 and the back surface electrode 14.

Subsequently, a Ti film of 100 nm thick and an Al film of 5 μm thick were successively formed in the same sputtering apparatus. The Al film was patterned by photolithography and etching to form the front surface electrode 12. The Ni film was patterned by photolithography and wet-etching to form the barrier layer 11 that is 3 μm outwardly larger than the area of the front surface electrode 12.

Thereafter, a polyimide film 13 was formed by coating polyimide to 10 μm thick and patterning it by photolithography and etching. Then, on the back surface electrode 14, a Ti film of 100 nm and a gold (Au) film of 200 nm were formed by vapor evaporation. This way, a trench gate MOSFET in which the polysilicon of the gate electrode 17 selectively contains only $^{11}$B was manufactured.

Comparison Example 2

A trench gate MOSFET in which the polysilicon of the gate electrode 17 contains $^{11}$B and $^{10}$B at the natural abundance ratio (80.1%:19.9%) was manufactured as Comparison Example 2. Its manufacture method was same as that of the trench gate MOSFET of Working Example 1 except for the formation of the gate electrode 17, and therefore, the descriptions thereof are omitted here.

To form the gate electrode 17, a p$^+$ polysilicon film 7 was formed on the gate insulating film 6 by the CVD method using monosilane (SiH$_4$) and diborane (B$_2$H$_6$). This process filled the inside of the trench 31 with the p$^+$ silicon film 7. Then the p$^+$ polysilicon film 7 was etched form the top surface by dry etching to form the gate electrode 17 embedded in the trench 31. As a result, the polysilicon of the gate electrode 17 contained $^{11}$B and $^{10}$B at the natural abundance ratio (80.1%:19.9%).

An AC voltage application test was performed on the planar gate MOSFETs and the trench gate MOSFETs that have been manufactured as Working Example 1 and Comparison Example 1 and as Working Example 2 and Comparison Example 2, respectively, in order to evaluate relationships between the threshold voltage shifts and the boron impurities contents in the gate electrode 17.

Table 1 summarizes the results of the threshold voltage shift amounts when the AC voltage (+20V/-5V, 200 Hz) was are applied to the gates for each of the planar gate MOSFETs and the trench gate MOSFETs in the case of selectively containing $^{11}$B only as the boron impurities in the gate electrode 17 and in the case of containing $^{11}$B and $^{10}$B at the natural abundance ratio as the boron impurities in the gate electrode 17. It was found that the threshold voltage shifts were small in the case of selectively doping only $^{11}$B in the gate electrode 17. Specifically, when the gate electrode 17 selectively contained only $^{11}$B as the boron impurities, the threshold voltage shift was 0.08V in the planar gate MOSFET, and was -0.03V in the trench gate MOSFET. In contrast, when the gate electrode 17 contained both $^{11}$B and $^{10}$B as the boron impurities, the threshold voltage shift was 0.50V in the planar gate MOSFET, and was -0.25V in the trench gate MOSFET.

TABLE 1

| | Threshold Voltage Shift |
|---|---|
| Working Example 1 | 0.08 V |
| Comparison Example 1 | 0.50 V |
| Working Example 1 | -0.03 V |
| Comparison Example 1 | -0.25 V |

To investigate the effects of boron impurities in the gate electrode 17 upon the threshold voltage shifts, the concentrations of impurities contained in the gate electrode 17, in the gate insulating film 6, and in the silicon carbide substrate were evaluated. Because accurate measurement of the impurity concentrations in actual devices is not possible, evaluation samples were made to estimate (determine) these impurity concentrations. In order to evaluate the impurity concentrations accurately, the backside SIMS (Secondary Ion Mass Spectrometry) evaluation in which analysis at and adjacent to the specimen surface was approached from the backside of the specimen was performed.

Figure 11:
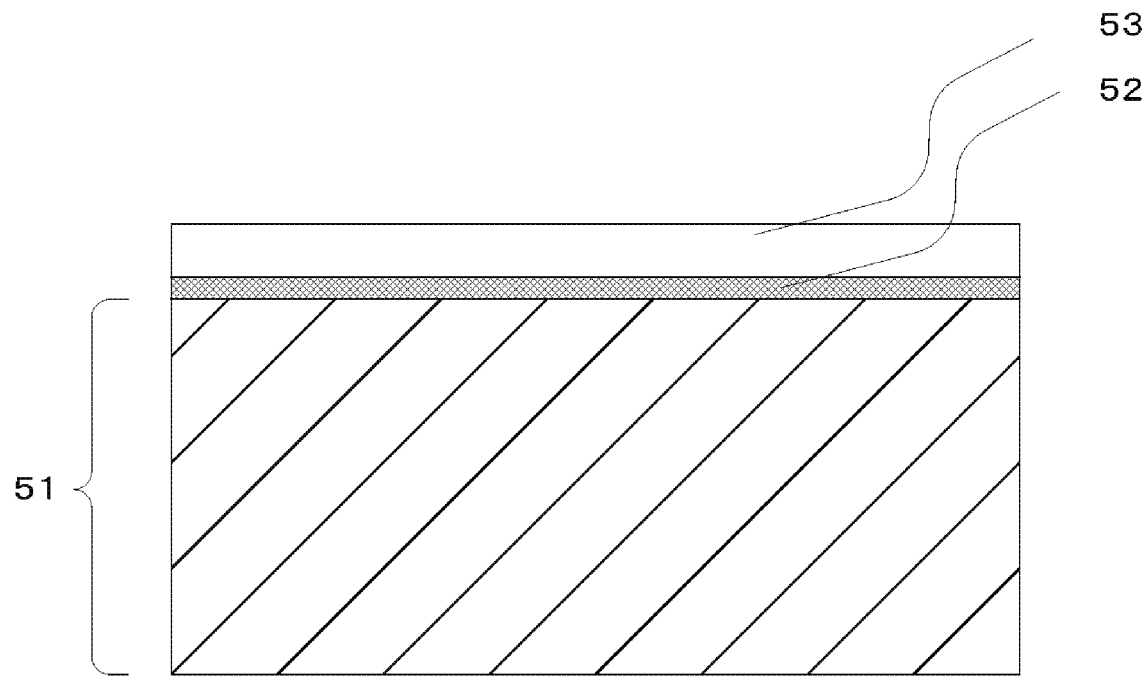
FIG. 11 schematically shows an evaluation sample for evaluating impurity concentration distributions.

FIG. 11 schematically shows an evaluation sample. Each evaluation sample was made by forming an silicon oxide film 52 and a polysilicon film 53 on a silicon carbide substrate 51. The formation conditions of the silicon oxide film 52 and the polysilicon film 53 were matched with the formation conditions of the gate insulating film 6 and the gate electrode 17 of Working Example 1, Comparison Example 1, Working Example 1, and Comparison Example 2, respectively, and therefore, four kinds of evaluation samples were manufactured. Also, each evaluation sample was subject to a thermal history that corresponds to thermal treatments during the actual manufacture process of a corresponding planar or trench gate MOSFET in order to reproduce the diffusion state of impurities. The backside SIMS analysis was performed on each evaluation sample.

Figure 12:
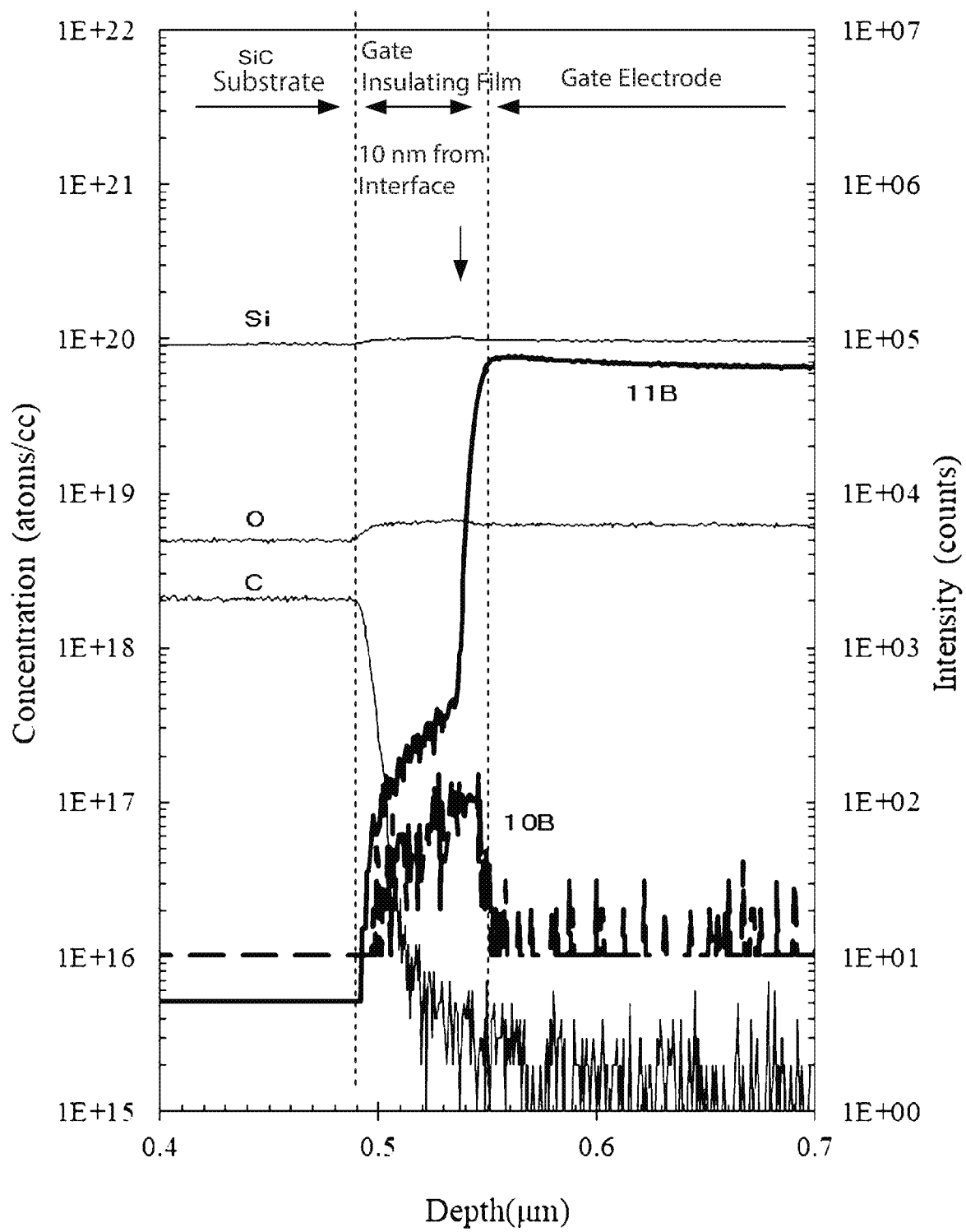
FIG. 12 shows impurity concentrations near the gate insulating film of a silicon carbide semiconductor device of Working Example 1.

FIG. 12 shows evaluation results of impurity concentrations near the gate insulating film 6 of the planar gate silicon carbide semiconductor device of Working Example 1. It was found that in the polysilicon film 53, which corresponds to the gate electrode 17, the $^{11}$B concentration was about $7 \times 10^{19}$ cm$^{-3}$, and that $^{11}$B was diffused into the silicon oxide film 52, which corresponds to the gate insulating film 6. Here, $^{10}$B was below the minimum detection limit.

Figure 13:
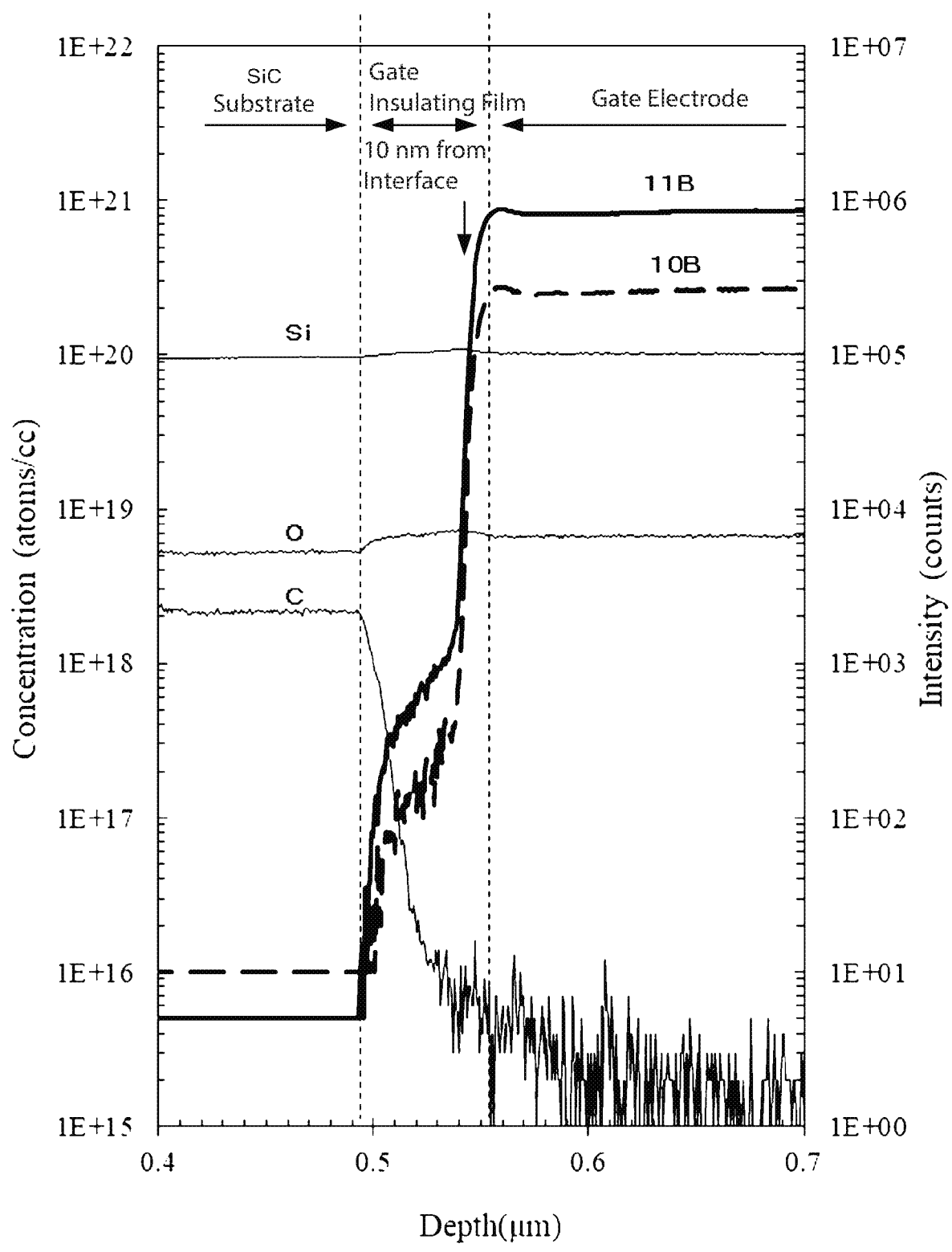
FIG. 13 shows impurity concentrations near the gate insulating film of a silicon carbide semiconductor devices of Comparison Example 1.

FIG. 13 shows evaluation results of impurity concentrations near the gate insulating film 6 of the planar gate silicon carbide semiconductor devices of Comparison Example 1. It was found that in the polysilicon film 53, the $^{11}$B concentration was about $8 \times 10^{20}$ cm$^{-3}$, and the $^{10}$B concentration was about $2 \times 10^{20}$ cm$^{-3}$, and that both $^{11}$B and $^{10}$B in B the polysilicon film 53, which corresponds to the gate electrode 17, were diffused into the silicon oxide film 52, which corresponds to the gate insulating film 6.

Although not shown in the drawings, the same evaluation was performed for the trench gate MOSFETs of Working Example 2 and Comparison Example 2.

Figure 14:
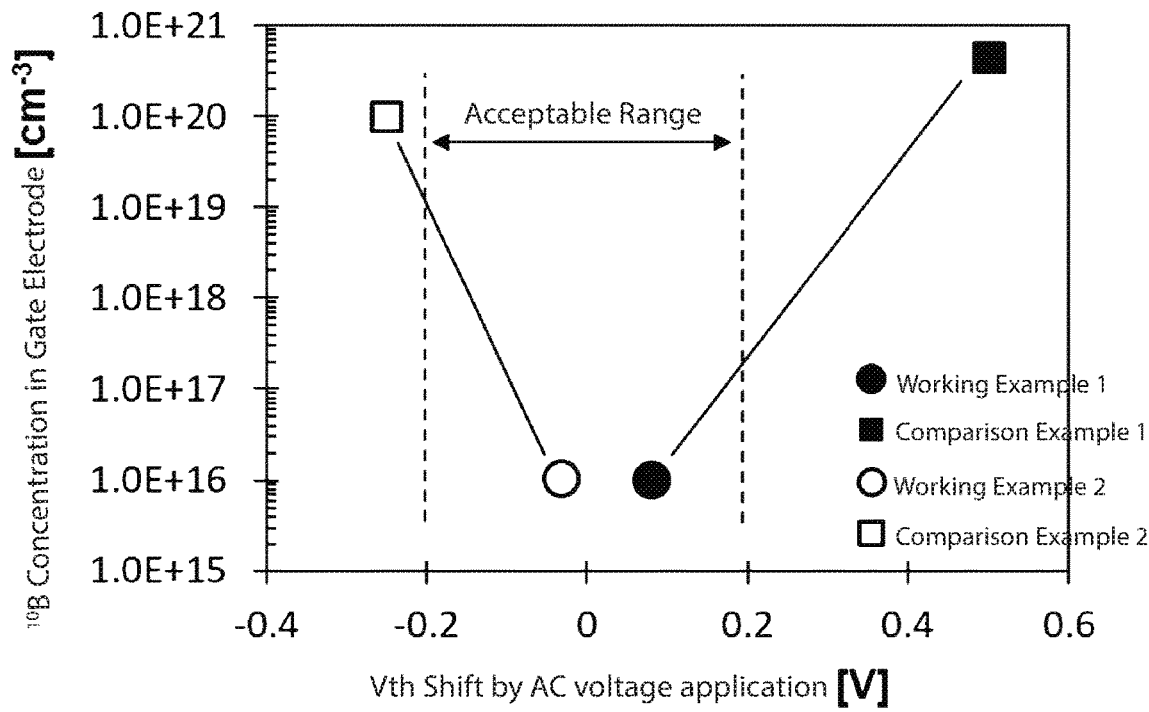
FIG. 14 shows relationships between the concentration of $^{10}$B in the gate electrode and threshold voltage shifts in various silicon carbide semiconductor devices.

FIG. 14 are graphs showing relationships between the concentration of $^{10}$B in the gate electrode 17, which were determined above, and the measured threshold voltage shifts due to the AC voltage application test. It was found that in both planar gate and trench gate MOSFETs, when the $^{10}$B concentration is small, the threshold voltage shift becomes small. Because of these experimental results, it was found for the first time in the art that $^{10}$B in the gate insulating film 6 influences the threshold voltage shifts. Here, the shift directions (polarities) and the shift amounts of the threshold voltage shifts differ between the planar gate MOSFETs and the trench gate MOSFETs. It is considered that these differences are due to the direction of the crystal plane on which the gate insulating film 6 was formed—i.e., the gate insulating film 6 is formed on the Si plane in the planar gate MOSFETs, whereas the gate insulating film 6 is formed on the m-plane in the trench gate MOSFETs.

As described above, it was found that the threshold voltage shifts in the silicon carbide semiconductor devices are caused by intrusion of $^{10}$B in the gate insulating film 6. Further, it was found that by having 90% or more of $^{11}$B and 10% or less of $^{10}$B, more preferably, 95% or more of $^{11}$B and 5% or less of $^{10}$B, the threshold shift can be effectively suppressed.

It was found from FIG. 14 that when the $^{10}$B concentration in the gate electrode 17 is equal to or less than $1.0\times10^{17}$ cm$^{-3}$, the threshold voltage shift can be suppressed to within ±0.2V for both planar gate and trench gate silicon carbide semiconductor devices. Here, it was assumed that the threshold voltage shift changes along a straight line to a point of the $^{10}$B detection limit of $1.0\times10^{16}$ cm$^{-3}$ in the gate electrode 17 in this graph.

Figure 15:
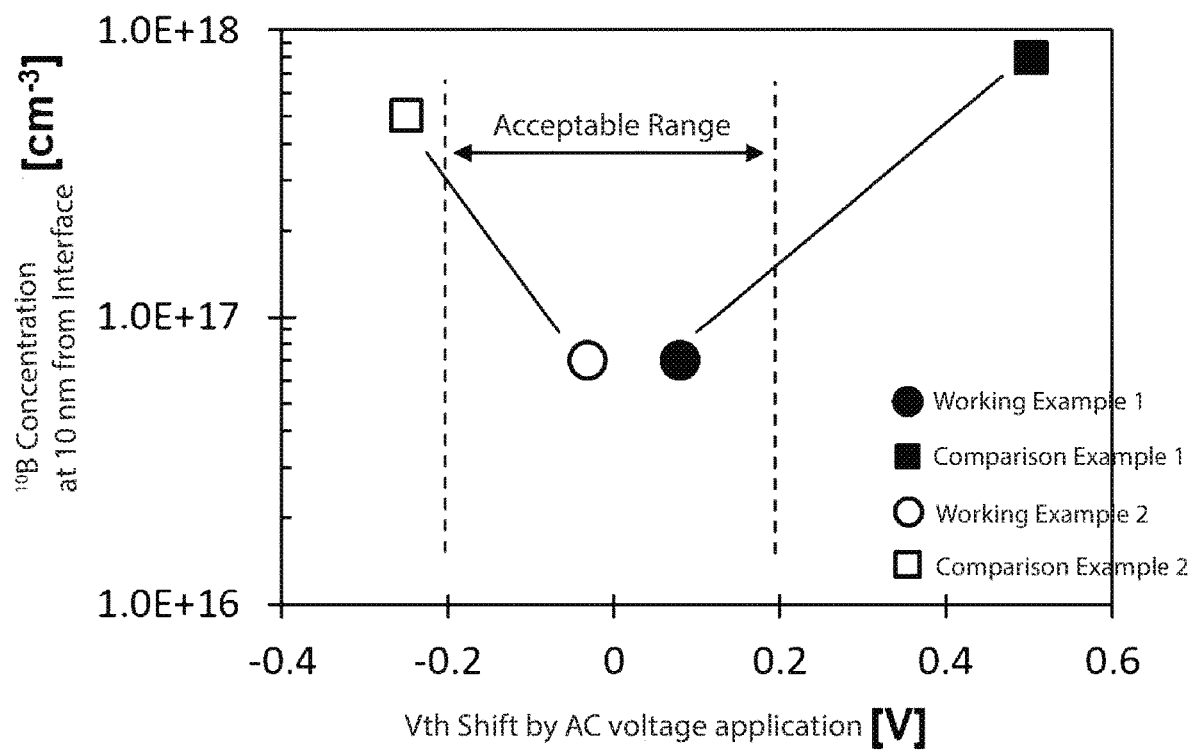
FIG. 15 shows relationships between the concentration of $^{10}$B in the gate insulting film at a location 10 nm deep inside from the interface between the gate electrode and the gate insulating film and threshold voltage shifts in various silicon carbide semiconductor devices.

FIG. 15 shows graphs indicating the concentrations of $^{10}$B in the gate insulating film 6 at a location 10 nm deep inside from the interface between the gate electrode 17 and the gate insulating film 6 and the threshold voltage shifts due to the AC voltage application test. It was found from FIG. 15 that the threshold voltage shift can be suppressed to within the acceptable range by making that the $^{10}$B concentration equal to or less than $1.5\times10^{17}$ cm$^{-3}$ for both planar gate and trench gate silicon carbide semiconductor devices. Here, it was assumed that the threshold voltage shift changes along a straight line to a point of the $^{10}$B detection limit of $1.0\times10^{17}$ cm$^{-3}$ in the gate insulating film 6 in this graph.

Figure 16:
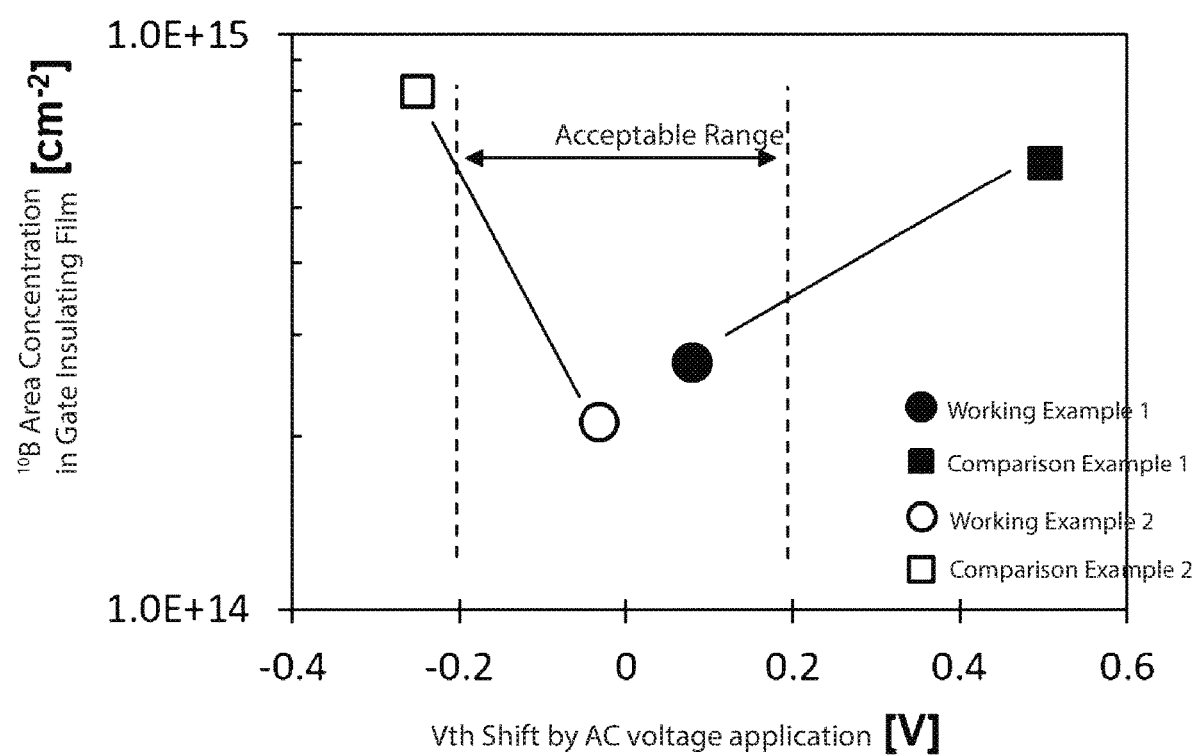
FIG. 16 shows relationships between the area concentration of $^{10}$B in the gate insulating film and threshold voltage shifts in various silicon carbide semiconductor devices.

FIG. 16 shows graphs indicating the area concentrations of $^{10}$B in the gate insulating film 6 and threshold voltage shifts due to the AC voltage application test. In the gate insulating film 6, $^{10}$B has a density distribution in the depth direction. Therefore, for ease of evaluation, $^{10}$B is represented by the area concentration. It was found from FIG. 16 that the threshold voltage shift can be suppressed to within the acceptable range by making the area concentration of $^{10}$B equal to or less than $2.5\times10^{14}$ cm$^{-2}$. Here also, it was assumed that the shift changes along a straight line in this graph.

Various embodiments of the present invention were explained in the case of MOSFETs above. But the present invention is not limited thereto, and is applicable to various other semiconductor devices, such as IGBT. Furthermore, although the first conductivity type was n-type and the second conductivity type was p-type in the descriptions of some of the embodiments above, the present invention is not limited thereto; similar or same advantages and effects can be obtained in the case of the first conductivity type being p-type and the second conductivity type being n-type.

The silicon carbide semiconductor device and its method of manufacture according to the present invention are useful in power semiconductor devices that are used in inverters and switching power supplies, for example.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A silicon carbide semiconductor device, comprising:
   a semiconductor substrate of a first conductivity type, made of silicon carbide;
   a semiconductor layer of the first conductivity type, made of silicon carbide, on a front surface of the semiconductor substrate;
   a first semiconductor region of a second conductivity type, made of silicon carbide, selectively disposed on the semiconductor layer;
   a second semiconductor region of the first conductivity type, made of silicon carbide, selectively disposed on the first semiconductor region;
   a third semiconductor region of the second conductivity type, made of silicon carbide, selectively disposed on the first semiconductor region, the third semiconductor region having a higher impurity concentration than the first semiconductor region;
   a gate insulating film disposed on a surface formed continuously by a surface of the semiconductor layer, a surface of the first semiconductor region, and a surface of the second semiconductor region;
   a gate electrode on the gate insulating film, made of p$^+$ polysilicon that includes boron as impurities;
   an interlayer insulating film covering the gate electrode, the interlayer insulating film having an opening partially exposing the second semiconductor region and the third semiconductor region;
   a source contact electrode in contact with the second semiconductor region and the third semiconductor region exposed in the opening of the interlayer insulating film;
   a conductive barrier film covering and contacting the interlayer insulating film and the source contact electrode;
   a front surface electrode covering and contacting the conductive barrier film; and
   a back surface electrode disposed on a back surface of the semiconductor substrate,
   wherein among boron impurities contained in the gate electrode, $^{11}$B is contained 90% or more.

2. The silicon carbide semiconductor device according to claim 1, wherein among the boron impurities contained in the gate electrode, $^{11}$B is contained 95% or more.

3. The silicon carbide semiconductor device according to claim 1, wherein a concentration of $^{10}$B impurities in the gate electrode is $1\times10^{17}$ cm$^{-3}$ or less.

4. The silicon carbide semiconductor device according to claim 1, wherein a concentration of $^{10}$B impurities is $1.5\times10^{17}$ cm$^{-3}$ or less in the gate insulating film at a position 10 nm deep inside from an interface between the gate electrode and the gate insulating film.

5. The silicon carbide semiconductor device according to claim 1, wherein an area concentration of $^{10}$B impurities in the gate insulating film is $2.5\times10^{14}$ cm$^{-2}$ or less.

6. The silicon carbide semiconductor device according to claim 1, wherein the interlayer insulating film is a laminate film including a first interlayer insulating film that does not include boron and that is in contact with the gate electrode and a second interlayer insulating film covering the first interlayer insulating film.

7. The silicon carbide semiconductor device according to claim 6, wherein the first interlayer insulating film is made of NSG and the second interlayer insulating film is made of BPSG.

8. A method of manufacturing a silicon carbide semiconductor device, comprising:
- forming a semiconductor layer of a first conductivity type, made of silicon carbide, on a front surface of a semiconductor substrate of a first conductivity type made of silicon carbide;
- forming a first semiconductor region of a second conductivity type, made of silicon carbide, selectively on the semiconductor layer;
- forming a second semiconductor region of the first conductivity type and a third semiconductor region of the second conductivity type, both made of silicon carbide, selectively on the first semiconductor region;
- forming a gate insulating film on a surface formed continuously by a surface of the semiconductor layer, a surface of the first semiconductor region, and a surface of the second semiconductor region;
- forming a non-doped polysilicon film on the gate insulating film;
- ion-implanting only $^{11}$B impurities selectively among boron isotopes into the non-doped polysilicon film to form a gate electrode made of p$^+$ polysilicon;
- forming an interlayer insulating film covering the gate electrode, the interlayer insulating film having an opening partially exposing the second semiconductor region and the third semiconductor region;
- forming a source contact electrode in contact with the second semiconductor region and the third semiconductor region exposed in the opening of the interlayer insulating film;
- forming a back surface electrode on a back surface of the semiconductor substrate;
- forming a conductive barrier film covering and contacting the interlayer insulating film and the source contact electrode; and
- forming a front surface electrode covering and contacting the conductive barrier film.

9. The method according to claim 8, wherein the forming of the interlayer insulating film includes:
- forming a first interlayer insulating film that does not include boron, the first interlayer insulating film being in contact with the gate electrode; and
- forming a second interlayer insulating film covering the first interlayer insulating film, thereby forming the interlayer insulating film made of a laminate of the first interlayer insulating film and the second interlayer insulating film.

10. The method according to claim 8, further comprising:
- after the forming of the interlayer insulting film, performing a thermal treatment that rounds corners and ridges of the interlayer insulating film and that activates and diffuses the $^{11}$B impurities that have been ion-implanted into the gate electrode.

\* \* \* \* \*